(12) United States Patent
Djelassi

(10) Patent No.: US 11,867,128 B2
(45) Date of Patent: Jan. 9, 2024

(54) ADAPTIVE FILTERING METHOD

(71) Applicant: SAFRAN AIRCRAFT ENGINES, Paris (FR)

(72) Inventor: Cedrik Djelassi, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 856 days.

(21) Appl. No.: 16/959,835

(22) PCT Filed: Jan. 4, 2019

(86) PCT No.: PCT/FR2019/050010
§ 371 (c)(1),
(2) Date: Sep. 4, 2020

(87) PCT Pub. No.: WO2019/135053
PCT Pub. Date: Jul. 11, 2019

(65) Prior Publication Data
US 2021/0388771 A1 Dec. 16, 2021

(30) Foreign Application Priority Data
Jan. 4, 2018 (FR) ........................ 1850032

(51) Int. Cl.
*F02C 9/00* (2006.01)
*H03H 21/00* (2006.01)
(52) U.S. Cl.
CPC ........... *F02C 9/00* (2013.01); *H03H 21/0025* (2013.01); *F05D 2270/122* (2013.01); *F05D 2270/304* (2013.01); *F05D 2270/71* (2013.01)
(58) Field of Classification Search
CPC . F02C 9/00; H03H 21/0025; F05D 2270/122; F05D 2270/304; F05D 2270/71
(Continued)

(56) References Cited

U.S. PATENT DOCUMENTS

| 2002/0162317 A1 * | 11/2002 | Banaszuk | F23N 5/16 |
| | | | 60/764 |
| 2004/0230363 A1 * | 11/2004 | Kurt-Elli | G01M 15/12 |
| | | | 701/100 |

(Continued)

FOREIGN PATENT DOCUMENTS

| AU | 2015272001 A1 * | 7/2016 | ............. F02B 37/00 |
| CA | 2503358 C * | 7/2011 | ............. F01D 17/02 |

(Continued)

OTHER PUBLICATIONS

Gelfand et al., "A Tree-Structured Piecewise Linear Adaptive Filter", 8097 IEEE Transactions on Information Theory vol. 39, No. 6, Nov. 1993, XP 000433059, pp. 1907-1922 (total 16 pages).

(Continued)

*Primary Examiner* — Atul Trivedi
(74) *Attorney, Agent, or Firm* — Sughrue Mion, PLLC

(57) ABSTRACT

The invention relates to a method for filtering an input signal (3*b*, 4*b*, 5*b*) relative to a physical variable of a turbine engine (9), the input signal being digitised, the method implementing frequency filtering of said signal in a computer (6) of a control system (7) of said turbine engine (9), said signal being provided at the input of the computer, a digital derivative of said signal being intended for being used by the control system (7), characterised in that it involves: —detecting an amplitude variation of said variable on said input signal, by a step of generating a second derivative signal (S) of the input signal and a step of comparing a value of the second derivative value of the input signal with at least one predetermined threshold ($S_1 \ldots S_n$); and —adapting the frequency filtering of said input signal as a function of the detected amplitude variation of said variable, by a step of controlling a controlled filter ($PB_{11}$) capable of applying frequency filtering to the input signal, so that the controlled (Continued)

filter applies or does not apply the frequency filtering as a function of a result of the comparison step.

12 Claims, 5 Drawing Sheets

(58) Field of Classification Search
USPC .......................................................... 701/100
See application file for complete search history.

(56) References Cited

U.S. PATENT DOCUMENTS

| | | | | |
|---|---|---|---|---|
| 2006/0185445 A1* | 8/2006 | Delcher | ................ | F01D 21/003 |
| | | | | 73/862.325 |
| 2014/0091785 A1* | 4/2014 | Wherritt | .................. | G01B 7/14 |
| | | | | 324/207.15 |
| 2014/0277789 A1* | 9/2014 | Stuttaford | ................ | F02C 9/22 |
| | | | | 700/287 |
| 2014/0327489 A1* | 11/2014 | Tang | .................... | H03H 7/0153 |
| | | | | 333/17.1 |
| 2015/0029053 A1* | 1/2015 | Dewberry | ............... | G01S 11/02 |
| | | | | 342/118 |
| 2015/0134270 A1* | 5/2015 | Long | .................... | G01M 15/14 |
| | | | | 702/33 |
| 2015/0260557 A1* | 9/2015 | DeSilva | .................... | G01F 1/66 |
| | | | | 702/48 |
| 2015/0260612 A1* | 9/2015 | DeSilva | .................. | G01F 1/668 |
| | | | | 702/48 |
| 2016/0090187 A1* | 3/2016 | Certain | .................. | B64D 31/06 |
| | | | | 60/773 |
| 2019/0121348 A1* | 4/2019 | Cella | ....................... | G06N 3/084 |
| 2020/0201292 A1* | 6/2020 | Cella | ................. | G05B 23/0259 |
| 2021/0326542 A1* | 10/2021 | Hong | ................. | G06K 7/10059 |
| 2022/0315205 A1* | 10/2022 | Moy | ..................... | G05D 1/0858 |
| 2022/0326704 A1* | 10/2022 | Moy | ..................... | G05D 1/0011 |
| 2023/0139984 A1* | 5/2023 | Hindle | ................. | B60K 5/1283 |
| | | | | 244/58 |

FOREIGN PATENT DOCUMENTS

| | | | | |
|---|---|---|---|---|
| CA | 2915466 A1 * | 7/2016 | .............. | F02B 37/00 |
| CA | 3069356 A1 * | 8/2020 | ........... | B64C 11/385 |
| CN | 108431360 A * | 8/2018 | ............... | E21B 7/06 |
| CN | 108431363 A * | 8/2018 | ............. | E21B 17/05 |
| CN | 115539210 A * | 12/2022 | | |
| EP | 4050199 A1 * | 8/2022 | | |
| FR | 2842901 A1 | 1/2004 | | |
| GB | 2528882 A * | 2/2016 | ............. | B64D 27/16 |
| RU | 2730568 C1 * | 8/2020 | | |
| WO | 2014/053752 A1 | 4/2014 | | |
| WO | 2015/019003 A1 | 2/2015 | | |
| WO | WO-2019135053 A1 * | 7/2019 | ................ | F02C 9/00 |
| WO | WO-2020249489 A1 * | 12/2020 | ............. | F03D 13/20 |

OTHER PUBLICATIONS

International Search Report dated Apr. 26, 2019 in PCT Application No. PCT/FR2019/050010.

Search Report dated Nov. 28, 2018 from French Patent Office in FR Application No. 1850032.

* cited by examiner

ADAPTIVE FILTERING METHOD

CROSS REFERENCE TO RELATED APPLICATIONS

This application is a National Stage of International Application No. PCT/FR2019/050010, filed Jan. 4, 2019, claiming priority to French Patent Application No. 1850032, filed Jan. 4, 2018, the entire contents of each of which are herein incorporated by reference in their entireties.

FIELD OF THE INVENTION

The invention relates to a device for filtering a measured signal relating to a physical quantity of a turbine engine, typically the angular speed of an engine shaft of a turbine engine, in order to produce a base signal, typically the derivative signal of the speed signal, intended to be used in a control system of the turbine engine.

The invention also relates to a turbine engine, the control system of which contains a filtering device of this type.

Presentation of the Prior Art

In the control of a parameter of a system, it is customary to establish the derivative of the signal of this physical quantity to use it in a feedback loop.

For instance, in a twin spool dual flow turbojet, it is important to control at least an angular speed of an engine shaft in one of the two spools. It is generally intended to control the speed of rotation N2 (in rpm or revolutions per minute) of the high-pressure spool, or even also the speed of rotation N1 (in rpm or revolutions per minute) of the low-pressure spool. The control can be carried out by using an angular speed sensor, which produces a signal the amplitude of which is generally a function of the speed and which is differentiated before injecting it into the feedback loop of the control system.

It is possible that noise perturbs the signal of the physical quantity to be controlled, or even its derivative signal, in particular in cases where the amplitude of the signal is particularly weak relative to the greatest amplitudes that the signal can have. This reduces the performance of the control system, because the use by the control system of this signal or of its derivative signal with an amplitude that is less than the corresponding noise becomes a problem.

Noise can originate in particular from the digitization of the signal. The signal is transformed into a time series of measured values, a sampling step $\Delta t$ separating in time two successive measured values. A quantification step or numerical resolution gives the minimum difference between two different measured values. The degradation that the signal undergoes during an analog/digital conversion is similar to the degradation that noise superimposed on the signal would produce. This noise is called quantification noise or sampling noise. In this text, a digitized signal designates a signal transformed by analog/digital conversion with a sampling step and a quantification step, and which has quantification noise.

Concretely, due to this noise, it is possible to observe between two consecutive samplings steps a variation of at least one quantification step in the digitized signal, while the real value of the physical quantity is stable.

For example, sampling noise (also called quantification noise) can appear if the measured signals of the physical quantities N1 and N2 are digitized over time. For signal N2 digitization takes place conventionally with a sampling step in time $\Delta t$ equal to 30 ms=0.03 s and a quantification step (numerical resolution) in angular speed $\Delta N$ equal to 1 rpm=1 revolution per minute. The numerical derivative of this signal, corresponding to the angular acceleration dN2/dt, is digitized with a minimum step between two consecutive values equal to the ratio $\Delta N/\Delta t$. Conventionally, for signal dN2/dt, this ratio is therefore greater than 30 rpm/s, and consequently an angular acceleration setpoint less than 20 rpm/s can neither be correctly measured nor monitored by the system.

Generally, the use of a numerical derivative of a digitized signal by a control system creates limits in the precision of acceleration setpoints. This obstacle can be associated in particular with transitional phases of operation of a turbine engine and with the control of the turbojet in engine regime acceleration in which the control of a physical quantity of the turbine engine can require the numerical derivative of the digitized signal relating to this physical quantity.

There exist other examples of measured parameters of a turbine engine, the amplitudes of which vary within a very large range, and the digitization of which can therefore cause sampling noise, particularly for signals of vary small amplitude. As examples of such parameters can be cited the pressure or the derivative of the pressure measured in a zone of the turbine engine, for example at the inlet or the outlet of a compressor of the low-pressure spool or of the high-pressure spool.

The conventional solution aimed at palliating the noise problem consists of filtering the signals prior to their injection into the feedback loop of the control system. The filter reduces noise but it also acts upon the time domain dynamics of the filtered signal compared with the signal prior to filtering. The performance of the control system is thereby impacted.

PRESENTATION OF THE INVENTION

A general goal of the invention is to mitigate the disadvantages of the control systems of the prior art.

In particular, one aim of the invention is to propose a solution allowing both effective filtering and the absence of degradation of the dynamics of the control system.

Particularly proposed is a method for filtering an input signal relating to a physical quantity of a turbine engine, the input signal being digitized, the method implementing, in a computer of a control system of said turbine engine, frequency filtering of said signal, said signal being supplied at the input of the computer, characterized in that the following are implemented
  detecting, in said input signal, a variation of amplitude of said physical quantity,
  adjusting the frequency filtering of said input signal depending on the detected variation of amplitude of said physical quantity.

The physical quantity that it is desired to use for the control of the turbine engine can have different levels of amplitude characteristics that are very different, for example different regime of an engine shaft extending from idle until full acceleration and for which the signal representing the engine regime sweeps over a very large amplitude.

As the input signal is digitized, it originates in a transformation by analog/digital conversion with a sampling step and a quantification step, and has quantification noise.

The effect of noise in the signal measurement can then be different from one level of amplitude to another, for example from one regime to another, just as the need in terms of filtering is not the same from one regime to another.

By using the proposed method, it is possible to satisfy filtering needs of the input signal of a physical quantity used for the control of the turbine engine, for example the speed of the engine shaft, which differs depending on the regime or generally depending on the amplitude swept by said physical quantity, and to ensure better performance of the control system relative to a control system which would implement the same filtering regardless of the amplitude swept by said physical quantity.

The method is advantageously completed by the following steps:
- generating a second derivative signal of the input signal,
- comparing a value of the second derivative signal of the input signal with at least one predetermined threshold,
- controlling a controlled filter, capable of applying frequency filtering to the input signal, so that the filter applies the frequency filtering, or does not, depending on a result of the comparison.

According to one possible implementation mode, the input signal passes through a filter distinct from the controlled filter so that a frequency filtering of the input signal is accomplished by the filter distinct from the controlled filter, regardless of the result of the comparison step, the filter distinct from the controlled filter being arranged either upstream or downstream from the controlled filter.

According to one aspect of the invention, the value of the second derivative of the signal representing the measured physical quantity is generated and used to characterize the regime or amplitude transitions swept by this physical quantity used for the control of the turbine engine. It is possible to compare this value of the second derivative to an arbitrarily elevated number of thresholds and to define as many corresponding filtering configurations. This allows adjusting the frequency filtering to as many different filtering configurations as desired.

According to one possible implementation mode, the method can further comprise steps of:
- comparing a value of the second derivative signal of the input signal with several predetermined thresholds,
- controlling several controlled filters, each capable of applying frequency filtering to the input signal, so that the controlled filter applies, or does not apply the frequency filtering depending on a result of the comparison to one of the thresholds.

Advantageously, the method can be configured so that:
- each controlled filter is capable of applying frequency filtering of the low-pass type, each controlled filter being associated with a predetermined threshold;
- the control of a controlled filter is configured so that the controlled filter does not apply the frequency filtering if a value of the second derivative signal of the input signal is greater than its associated predetermined threshold.

This implementation mode brings a solution in controlling the angular speed N2 of the high-pressure spool of a turbine engine, when its signal is perturbed by sampling noise. Conventionally, a low-pass filter is used to dispense with sampling noise, such as for example a "moving average," which consists of replacing the latest value of the signal by an average of this value and of "n" preceding values. The effect on the dynamics of the filtered signal is the generation of a delay relative to the real signal: a variation in the real signal appears later in the filtered signal. This delay, in the particular case of "moving averages," increases if the number "n" is increased or if the "moving average" step is carried out several times. A controlled system which uses a filter of this type can therefore react to a variation of the real signal with a delay.

In addition, in the case of the dN2/dt signal in twin spool dual flow turbojets, two opposite regimes can be distinguished, where the characteristics of the signal capable of correctly controlling the system are different.

The first zone corresponds to a stable regime (typically the cruise phase of an airplane): the real dN2/dt signal is centered on zero and has few rapid variations. The sampling noise which contaminates the digitized dN2/dt signal produces a low signal-to-noise ratio, which requires sufficiently filtering the real signal to increase this signal-to-noise ratio. Moreover, as the regime is stable, it is not necessary that the delay of the control signal relative to the real signal be low. It is therefore possible to use a highly filtered signal for this first operating zone without having the generated delay reducing the performance of the control.

The second zone corresponds to a regime of rapid variations (typically the approach phase of an airplane): The real dN2/dt signal has rapid and large variations. The sampling noise which contaminates the digitized dN2/dt signal leaves a high signal-to-noise ratio, which leaves the freedom to not filter the real signal. In this operating zone, it is necessary that the delay of the control signal relative to the real signal be as low as possible. It is not therefore allowed to use a nonfiltered or slightly filtered signal for this second zone of operation.

In this implementation mode of the invention applied to the control of the angular speed N2, the nearer the rapid variation regime, the higher the value of a second derivative of the input signal.

This value can exceed a predetermined threshold, so that the controlled filter does not apply the frequency filtering with a smaller delay to the real signal.

Conversely, the nearer the stable regime, the smaller the value of a second derivative of the input signal, the more this value is exceeded (in absolute value) by a predetermined threshold and the more the signal-to-noise ration of the filtered signal increases.

Overall, the signal filtered by such a method has a sufficiently small delay in all the speed regimes of the engine shaft relative to the real signal, and a sufficiently large signal-to-noise ratio to control the controlled system satisfactorily.

Advantageously, the method can further comprise the steps of:
- receiving by at least one two-input and one output comparator, at a first input, a second derivative signal of the input signal and at the second input, a signal corresponding to a predetermined threshold,
- generating, by at least one comparator, a comparison signal corresponding to the result of the comparison between the signals received at its two inputs,
- receiving by at least one channel selector at:
  - a first input channel,
  - a second input channel,
  - a control input and
  - an output,
- the comparison signal at its control input, each channel selector being associated with a controlled filter capable of applying frequency filtering,
- receiving, at one of the first input channels, at least one channel selector, of the input signal of its associated controlled filter, and at its second input channel, a signal to which its associated controlled filter has applied frequency filtering, transmitting to the output of the channel selector one of its two signals, depending on the value of the comparison signal.

Moreover, the step of generating a second derivative signal of the input signal can comprise the following steps:

generating a first derivative signal of the input signal by application of a differentiating filter to the input signal, generating a first derivative signal filtered by application of at least one frequency filter of the "low-pass" type to a first derivative signal, generating a second derivative signal by application of a differentiating filter to a filtered first derivative signal.

The type of low-pass filter can be freely selected among the averages over multi-steps, the low-pass filters of order 1, 2 or higher, the low-pass filters with finite (FIR filter) or infinite (RII filter) impulse response.

The physical quantity of the turbine engine to which the input signal filtered by one of the filtering methods described above relates can be the angular speed of an engine shaft of the turbine engine.

The invention also relates to a computer of a control system of a turbine engine configured to implement methods as describe in this section, said computer receiving as input an input signal relating to a physical quantity of the turbine engine and generating as output a base signal used in the control of the angular speed of the engine shaft.

The invention further relates to an assembly including a turbine engine comprising at least one engine shaft and a control system of the angular speed of an engine shaft of the turbine engine, said control system including a computer as described in this section, said computer receiving as input an input signal relating to a physical quantity of the turbine engine and generating as output a base signal used in the control of the angular speed of the shaft, the control system controlling the turbine engine depending on the filtered measurement signal thus generated by said computer.

According to another possible mode, the control system uses a numerical derivative of the angular speed of the engine shaft to control the turbine engine in acceleration of the engine regime, and the control system is designed to supply angular acceleration setpoints which can have values smaller than the ratio of a quantification step to a sampling step of the digitized input signal, the input signal being a measurement of the angular speed.

Finally, the invention also relates to a computer program comprising instructions suited to the implementation of each of the steps of the method as described in this section, when said program is executed on a computer.

PRESENTATION OF THE FIGURES

Other features and advantages of the invention will still be revealed by the description that follows, which is purely illustrative and not limiting, and must be read with reference to the appended drawings in which.

DETAILED DESCRIPTION

Figure 1:
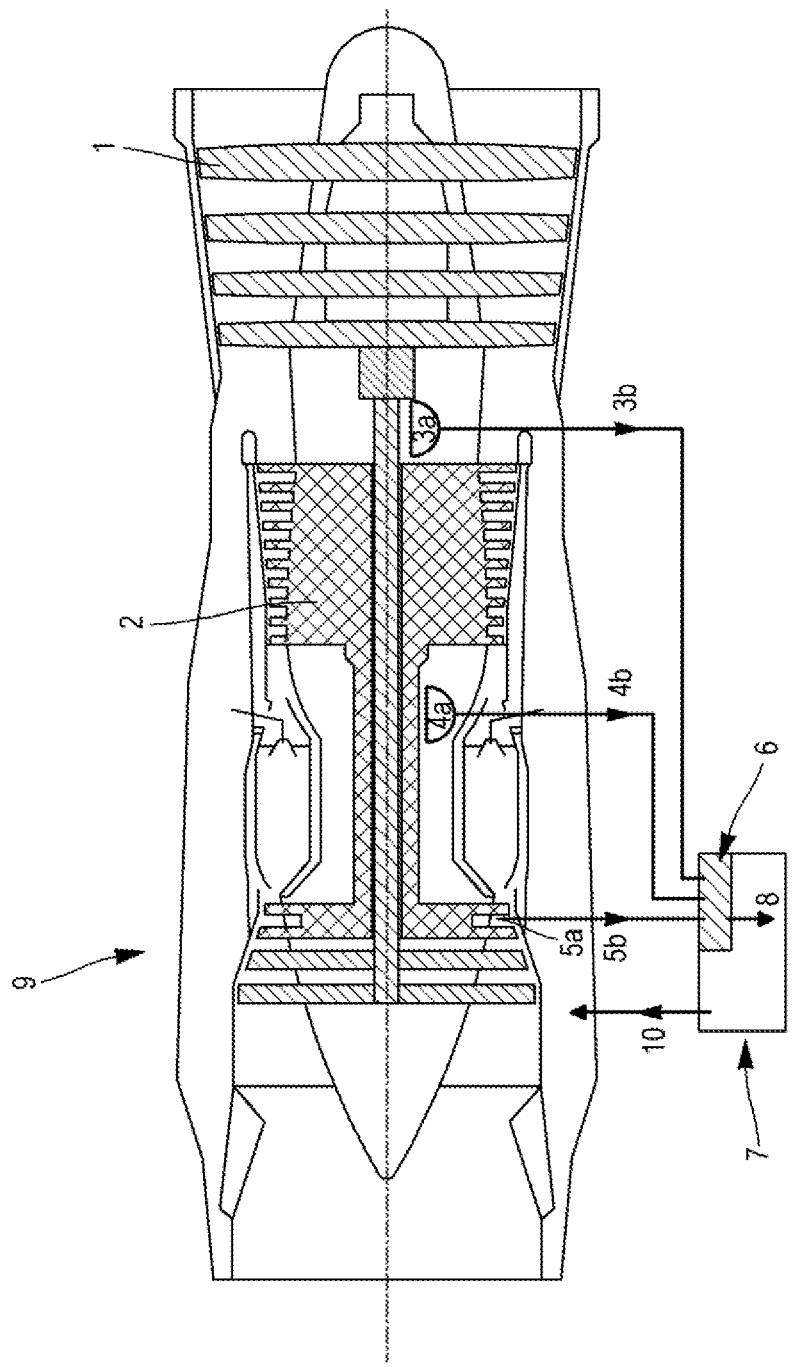
FIG. 1 shows schematically a twin spool dual flow turbojet in which the speeds of rotation N1 and N2 are controlled by a control system.

FIG. 1 shows schematically a twin spool dual flow turbojet 9 controlled by the control system 7. At least one of the physical quantities of the turbojet is measured thanks to a sensor: the rotation speed N1 of the low-pressure spool 1 can be measured by the speed sensor 3a which produces the input signal 3b depending on N1, the rotation speed N2 of the high-pressure spool 2 can be measured by the speed sensor 4a which produces the input signal 4b depending on N2.

Other physical quantities can be measured such as for example the pressure in a zone of the high-pressure spool 2 measured by a pressure probe 5a which produces the input signal 5b.

The input signals 3b, 4b and 5b are sent to a computer 6 which is a part of the control system 7.

The computer 6 delivers a base signal 8 relating to one of the physical quantities of which it has received the input signal, for example an angular speed signal.

This base signal 8 is used in the control of the turbojet, and in the production of the control signal 10 originating in the control system delivered to a control block of the turbine engine.

Figure 2:
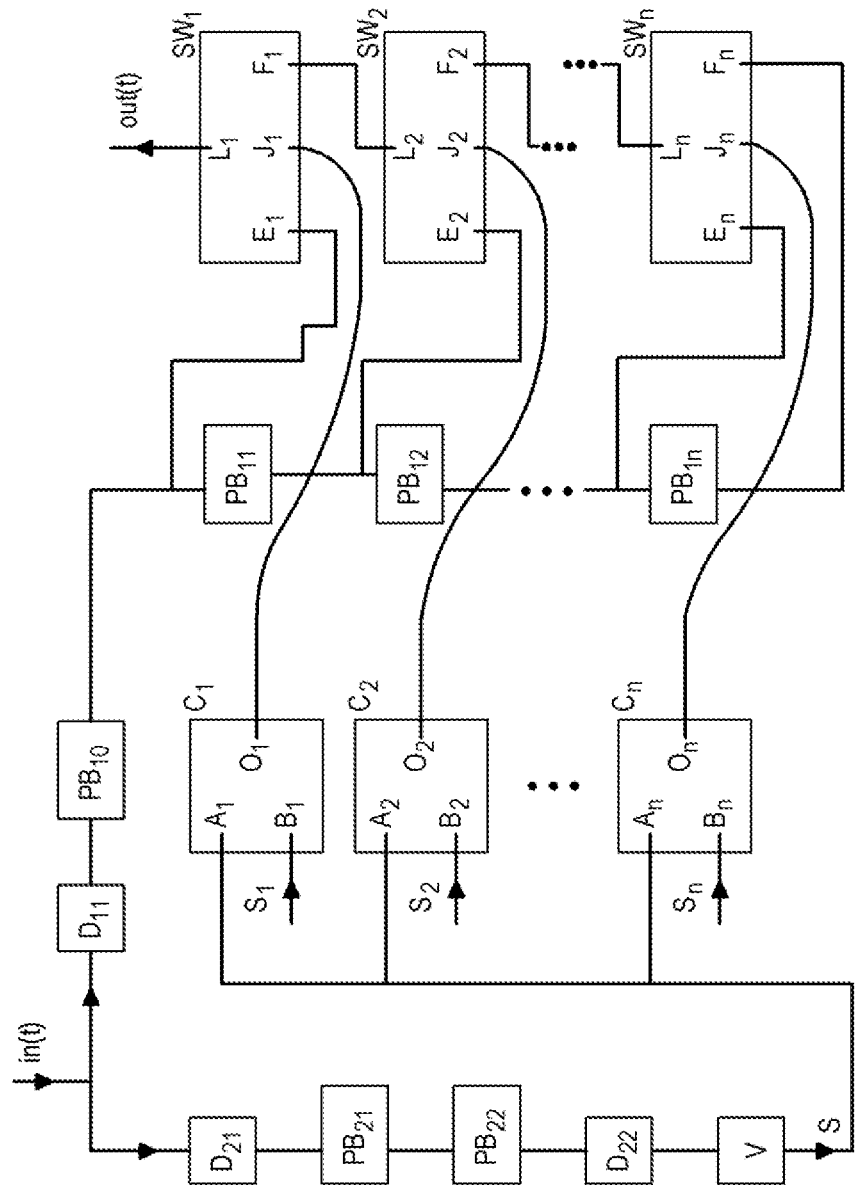
FIG. 2 shows a functional diagram of an adaptive digital filter according to a particular example of implementation of the invention.

FIG. 2 shows a functional diagram of the adaptive digital filter according to a particular implementation of the invention.

The input signal in(t) is applied to the inputs of the differentiating filters $D_{11}$ and $D_{21}$, the function of which consists of replacing the digitized value received in(t) with the value $$\frac{\text{in}(t) - \text{in}(t - \Delta t)}{\Delta t}$$

where $\Delta t$ is the time sampling step.

These digital filters use calculation programs to determine the numerical derivative of the digitized input signal.

The output of the differentiating filter $D_{11}$ is connected to the set of low-pass filters denoted $PB_{10}, PB_{11}, PB_{12} \ldots PB_{1n}$, which are arranged in series. Each low-pass filter $PB_{11}$, $PB_{12} \ldots PB_{1n}$ is a controlled filter associated with a channel selector denoted $SW_1, SW_2 \ldots SW_n$, and each low-pass filter input is connected to the first input channel $E_1$, $E_2 \ldots E_n$ of its associated control means. The second input channel $F_1, F_2 \ldots F_{n-1}$ of the channel selector $SW_1$, $SW_2 \ldots SW_{n-1}$ is connected to the output $L_2, L_3 \ldots L_n$ of the channel selector associated with the following filter in the series. The input $F_n$ of the channel selector $SW_n$ is connected to the output of its associated filter $PB_{1n}$, and the output $L_1$ of the channel selector $SW_1$ is connected to the output of the adaptive digital filter and corresponds to the output signal out(t). Each channel selector $SW_1, SW_2 \ldots SW_n$, receives a binary control signal at its control input $J_1$, $J_2 \ldots J_n$, and, depending on the value of the control signal, it delivers at the output $L_1, L_2 \ldots L_n$ either the signal received at the first input channel $E_1, E_2 \ldots E_n$, or the signal received at the second input channel $F_1, F_2 \ldots F_n$. The control input $J_1, J_2 \ldots J_n$, of each channel selector is connected to the output of a comparator element described below.

The differentiating filter $D_{21}$ is connected in series with, in this order, two low-pass filters $PB_{21}$ and $PB_{22}$, a differentiating filter $D_{22}$ and a block V which transforms the signal received at its input into its absolute value. The output of the block V is connected to the inputs $A_1, A_2 \ldots An$ of the comparator elements $C_1, C_2 \ldots C_n$. Each input $B_1, B_2 \ldots B_n$ of the comparators $C_1, C_2 \ldots C_n$ receives a constant and predetermined signal $S_1, S_2 \ldots S_n$. The signal generated at the output of the comparator corresponds to the two possible results of the comparison between its two inputs. The output $O_1$ (respectively $O_2, O_3 \ldots O_n$) of the comparator $C_1$ (respectively $C_2, C_3 \ldots C_n$) is connected to the control input $J_1$ (respectively $J_2, J_3 \ldots J_n$) of the channel selectors.

When the system is in operation, the digitized input signal of the adaptive filter in(t) is injected into the differentiating filter $D_{21}$ which produces the numerical first derivative of the signal, then $PB_{12}$ and $PB_{22}$ filter this derivative to avoid the quantification noise interfering excessively with the signal. $D_{22}$ and V produce a signal S which gives the variation level of the real signal and the regime or amplitude swept by the measured physical quantity. This value is then distributed over the n parallel lines each of which leads to a comparator associated with a particular threshold. All the comparators operate identically: if $A_k \geq B_k$ the output generated at $O_k$ equals 1, if $A_k < B_k$ the output generated at $O_k$ equals 0.

The different thresholds predetermined before the filtering operation are selected so that $S_1 > S_2 > S_3 > \ldots > Sn$.

Two consecutive thresholds $S_k > S_{k+1}$ bound the value V so that: $S_k > S \geq S_{k+1}$ At the input of the comparator $C_{k+1}$, $A_{k+1} = S \geq B_{k+1} = S_{k+1}$ and the signal $O_{k+1}$ delivered at the output equals 1.

This is also the case for all the comparators for which the threshold is less than $S_{k+1}$, i.e. the thresholds $S_{k+2}, S_{k+3}$ until $S_n$.

At the input of the comparator $C_k$, $A_k = S < B_k = S_k$ and the signal $O_k$ delivered at the output equals 0.

This is also the case for all the comparators for which the threshold is greater than $S_k$, i.e. the thresholds $S_{k-1}, S_{k-2}$ until $S_1$.

The comparators $C_1$ to $C_n$ deliver the signal 0 or 1 at the control input of the channel selectors $SW_1, SW_2 \ldots SW_n$. All the channel selectors operate identically, the signal delivered at the output L is equal either to the signal received at the first input channel E if the control signal equals 1, or the signal received at the second input channel F if the control signal equals 0.

The comparators $C_1$ to $C_k$ deliver signal 0 to the control input of the channel selectors $SW_1, SW_2 \ldots SW_k$. The signals received at the second input channels $F_1$ (respectively $F_2 \ldots F_k$) are therefore delivered to the outputs $L_1$ (respectively $L_2 \ldots L_k$).

The comparators $C_{k+1}$ to $C_n$ deliver signal 1 to the control input of the channel selectors $SW_{k+1}, Sw_{k+2} \ldots SW_n$. The signals received at the first input channels $E_{k+1}$ (respectively $E_{k+2} \ldots E_n$) are therefore delivered to the outputs $L_{k+1}$ (respectively $L_{k+2} \ldots L_n$).

Under these conditions, the output signal of the system out(t) corresponds to the digitized input signal of the adaptive filter in(t) which has passed through the differentiating filter $D_{11}$, then the low-pass filter $PB_{10}$, then the controlled low-pass filters $PB_{11}, PB_{12} \ldots PB_{1k+1}$ and finally the channel selectors $SW_1, SW_2 \ldots SW_{k+1}$.

The system therefore behaves in the following manner: if $S_k > S \geq S_{k+1}$ then the output signal of the system out(t) corresponds to the digitized input signal in(t) of the adaptive filter which has passed through k low as filters.

Under these conditions, if S increases the number k is reduced and the filtering is reduced, and conversely if S is reduced the number k increases and filtering increases.

The system therefore allows adjusting the number of controlled low pass filters which the numerical first derivative passes through depending on the value S, i.e. adjusting the intensity of filtering depending on the level of variations of the real signal, i.e. depending on the amplitude swept by the signal. In other words, in the case where the measured physical quantity represents an engine regime, the intensity of the filtering is adjusted depending on the level of variations in the regime.

In this system, the output signal of the system out(t) corresponds to the digitized input signal in(t) of the adaptive filter which has passed at least through the filter $PB_{10}$, distinct from the controlled filters $PB_{11}, PB_{12} \ldots PB_{1n}$ so that a frequency filtering of the input signal is accomplished by the filter $PB_{10}$ regardless of the result of the comparisons within the comparators $C_1, C_2 \ldots C_n$.

In other words, the input signal (3b, 4b, 5b) passes through filter $PB_{10}$ regardless of the value of the signal S which gives the level of variation of the real signal and the regime or the amplitude swept by the measured physical quantity.

The filter $PB_{10}$ is arranged upstream of the controlled filters $PB_{11}, PB_{12} \ldots PB_{1n}$, but the filter $PB_{10}$ can also be arranged downstream of these controlled filters, and be positioned after the output $L_1$ of the channel selector $SW_1$.

This particular implementation example of the invention requires low-pass filters, which are elements known to a person skilled in the art, like filters with finite or infinite impulse response, weighted moving averages, low pass filters of order 1, order 2, order 4, etc. A 2-step moving average receiving an input signal U(t) delivers the signal $$\frac{U(t) + U(t - \Delta t)}{2}$$

where $\Delta t$ is the time sampling step. A 4-step moving average corresponds to the formula $$\frac{U(t) + U(t - \Delta t) + U(t - 2\Delta t) + U(t - 3\Delta t)}{4}.$$

Figure 3:
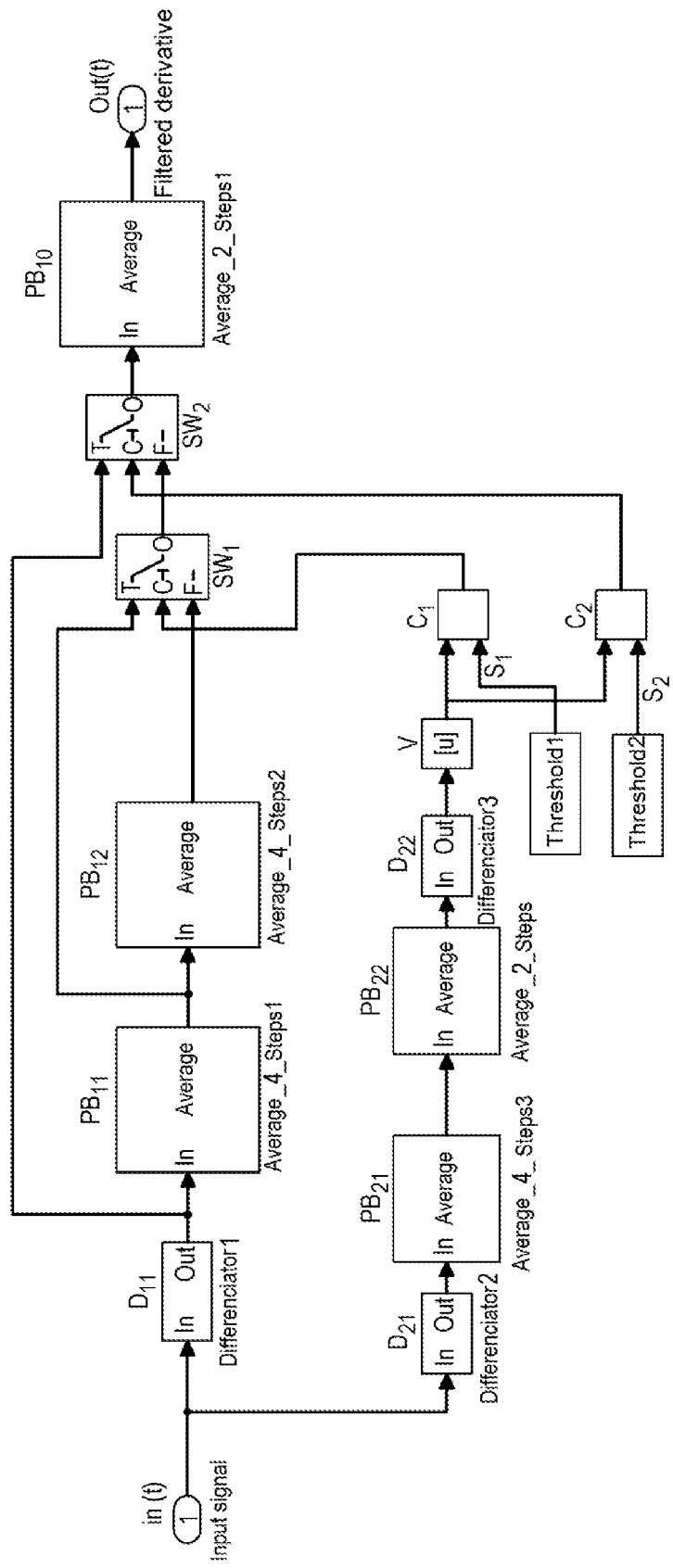
FIG. 3 shows a functional diagram of an embodiment of an adaptive digital filter according to a particular example of implementation of the invention, and comprising two thresholds.

FIG. 3 shows an adaptive digital filter functional diagram according to a particular implementation example of the invention, corresponding to the system shown in FIG. 2 in the case where n=2, with a single difference: the low-pass filter $PB_{10}$ is placed after the output of the last channel selector instead of being placed right after the differentiating filter $D_{11}$.

Once again the output signal of the system out(t) corresponds to the digitized input signal in(t) of the adaptive filter which has passed at least through the filter $PB_{10}$, distinct from the controlled filters $PB_{11}$ and $PB_{12}$. The input signal (3b, 4b, 5b) passes through the filter $PB_{10}$ regardless of the value of the signal S which gives the level of variation of the real signal and the regime or the amplitude swept by the measured physical quantity.

This time, the filter $PB_{10}$ is arranged downstream of the controlled filters $PB_{11}$, and $PB_{12}$, but the filter $PB_{10}$ can also be arranged upstream of these controlled filters, and be located between the differentiating filter Di 1 and the controlled filter $PB_{11}$.

The behavior of this system is exactly that of the system described by FIG. 2 in the case where n=2 and where:

$PB_{11}$, $PB_{12}$ and $PB_{21}$ are averages over 4 steps $PB_{10}$ and $PB_{22}$ are averages over 2 steps.

The system therefore allows adjusting the number of filters passed through (between 1 and 3) by the first numerical derivative depending on the value S compared to two thresholds, i.e. adjusting the intensity of filtering depending on the level of variations of the real signal, i.e. on the amplitude swept by the signal representing the measured physical quantity.

Figure 4:
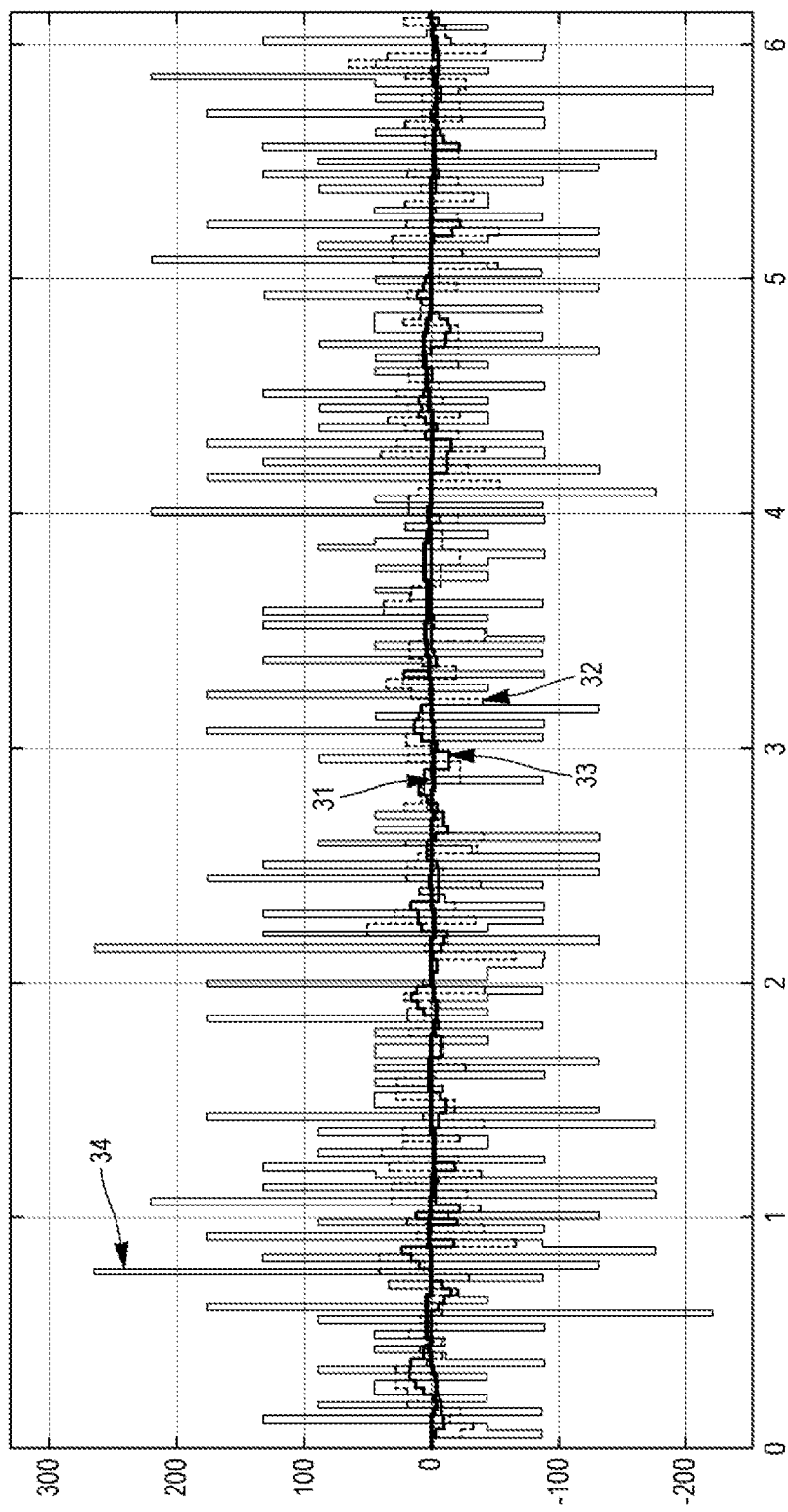
FIG. 4 shows the dN2/dt signal over time in a stable regime, within a controlled system in which the control signal makes use of the derivative signal dN2/dt.

FIG. 4 shows the signal dN2/dt over time in the stable regime, within a controlled system, the control signal of which makes use of the derivative signal dN2/dt. The four curves correspond to four different filtering situations of the derivative signal: dN2/dt is either filtered by a low-pass filter of order 4 (curve 31) or filtered by an average over 4 steps (curve 32) or filtered by an adaptive digital filter (curve 33) according to one implementation example of the invention corresponding to the functional diagram of FIG. 2, or not filtered (curve 34).

All these curves are centered on the value zero because, the angular speed N2 being constant, the derivative dN2/dt is zero on average. The curve 34 shows the highest signal-to-noise ratio; it is due essentially to the sampling noise, which is not filtered.

Curve 31 shows the lowest signal-to-noise ratio; it corresponds the highest filtering.

Curve 32 has a signal-to-noise ratio located between those of curves 31 and 34, because it corresponds to less filtering than the low-pass filter of order 4.

Finally, curve 33 has a signal-to-noise ratio located between those of curves 31 and 32. This shows that the performance of the adaptive digital filter in a stable regime are better than for a 4-step moving average but poorer than those of a low-pass filter of order 4.

Figure 5:
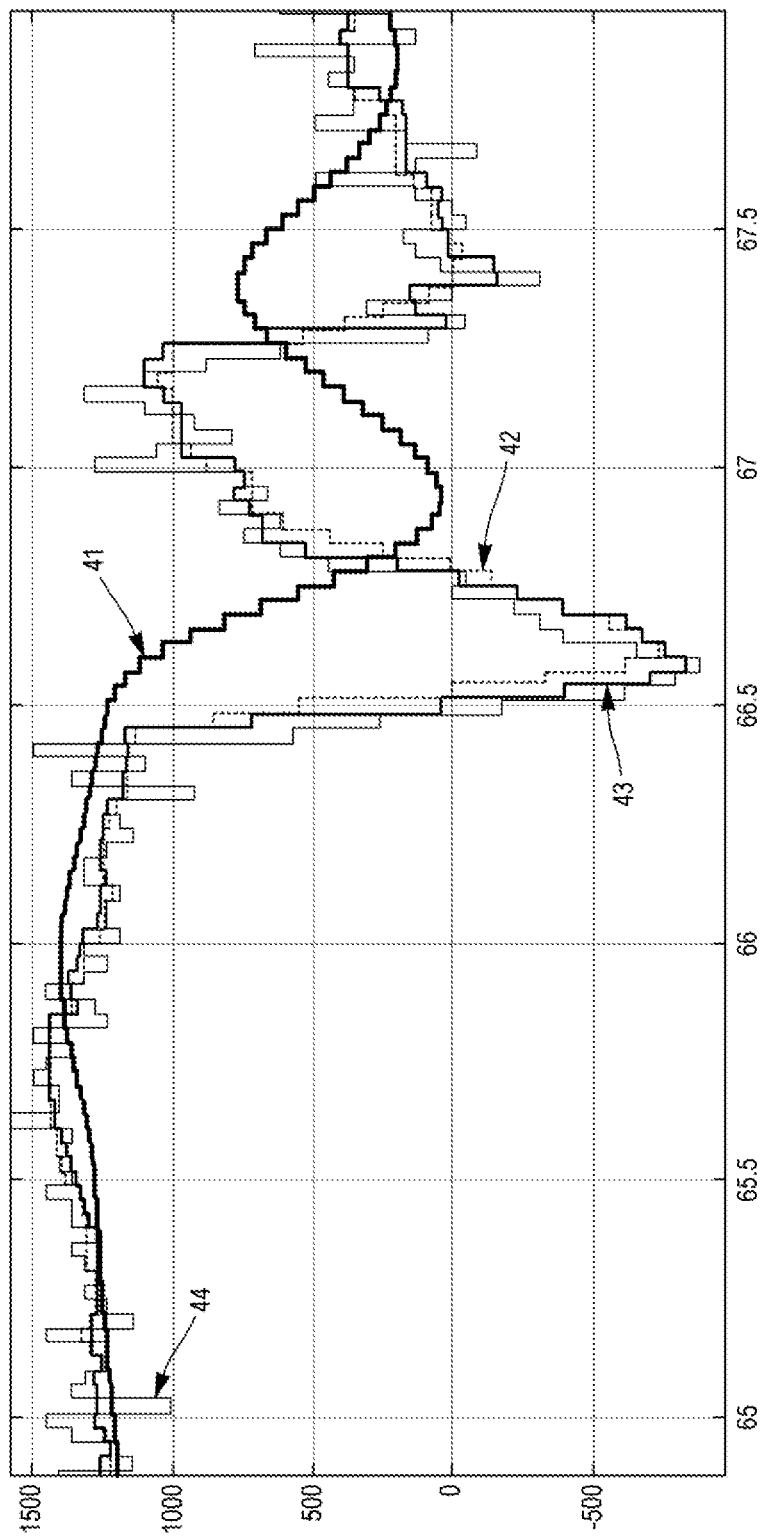
FIG. 5 shows the N2 signal over time in a rapid variation regime, within a controlled system in which the control signal makes use of the derivative signal dN2/dt.

FIG. 5 shows the signal N2 over time in a regime of rapid variations, within a controlled system with a loop that makes use of the derivative signal dN2/dt. The four curves correspond to the four filtering situations previously described for FIG. 4: a low-pass filter of order 4 (curve 41) or filtered by average over 4 steps (curve 42), adaptive digital filter (curve 43) according to a particular implementation example of the invention corresponding to the functional diagram of FIG. 2, not filtered (curve 44).

Curve 44 again shows the highest signal-to-noise ratio, still due to the unfiltered sampling noise. The signal varies considerably in passing from approximately 1200 rpm to 600 rpm, then it increases again until the value 1000 rpm.

The curve 41 shows the greatest delay relative to the unfiltered signal: this signal does decrease after curve 44 has reached its minimum and the signal even continues to decrease when curve 44 has already increased.

Furthermore, the amplitude of the variation of the unfiltered signal is not restored, the signal 41 passes from 1200 rpm to 0 rpm, then increases again toward 700 rpm.

Curve 42 has a smaller delay relative to the unfiltered signal and better restores the amplitude of the variation of the unfiltered signal.

Finally, curve 43 shows an even smaller delay and restores even better the amplitude of the variation of the unfiltered signal.

The adaptive digital filter therefore has better performance than the moving average over 4 points, both in a stable regime and in a regime with rapid variations. It has a favorable signal to noise ratio for control and little delay relative to the unfiltered signal in the regime with rapid variations.

This filter allows sufficiently small delay relative to the real signal and has a sufficiently high signal-to-noise ratio for controlling the system in the stable regime as in the regime with rapid variations.

The invention applies to the generation of a base signal used in the control of a turbine engine, in particular the control of angular speed of an engine shaft of the low-pressure spool or of the high-pressure spool of a twin spool dual flow turbine engine.

In particular, the adaptive digital filter is able to be used to control the turbine engine in acceleration of the engine regime. In the case where the speed of the shaft is digitized with a sampling step and a quantification step and it has quantification noise, the adaptive digital filter allows managing the control of angular acceleration setpoints which can have values less than the ratio of a quantification step to a sampling step of the digitized input signal. A numerical derivative of the angular speed is then used for control; this derivative can be generated by an adaptive filter as presented above.

The base signal can be generated based on an input signal relating to the angular speed N1 of the low-pressure spool, or N2 of the high-pressure spool, or of any engine shaft of a turbine engine in general. It can be generated from a measurement signal relating to other physical quantities of a turbine engine such as for example a pressure, the measurement of which is used in the control of the turbine engine.

The invention is not limited to the embodiments described and shown in the appended Figures. Modifications remain possible, particularly from the standpoint of the constitution of the various elements or the substation of technical equivalents, without however departing from the scope of protection of the invention.

The invention claimed is:

1. A method for filtering an input signal, the method implementing, in a computer of a control system of a turbine engine, frequency filtering of the input signal, the input signal measuring a physical quantity of the turbine engine, the input signal being digitized, the input signal being supplied at the input of the computer, a numerical time derivative of the input signal being intended to be used by the control system, the method comprising the following steps:
detecting, in the input signal, a variation of amplitude of the physical quantity, by a step of generating a second time derivative signal of the input signal and a step of comparing a value of the second time derivative signal with a predetermined threshold,
adjusting the frequency filtering of the input signal depending on the detected variation of amplitude of the physical quantity, by a step of controlling a controlled filter capable of applying frequency filtering of the low-pass type to the input signal, so that the controlled filter applies the frequency filtering if the value of the second time derivative signal of the input signal is inferior to the predetermined threshold.

2. The method according to claim 1, wherein the input signal passes through a second filter distinct from the controlled filter so that a frequency filtering of the input signal is accomplished by the second filter regardless of the result of the comparison step, the second filter being arranged either upstream or downstream of the controlled filter.

3. The method according to claim 1, wherein:
the step detecting, in the input signal, a variation of amplitude of the physical quantity further comprises comparing the value of the second time derivative signal with predetermined thresholds, and
the step of adjusting the frequency filtering of the input signal depending on the detected variation of amplitude of the physical quantity further comprises controlling controlled filters, each capable of applying frequency filtering to the input signal, so that each controlled filter applies, or does not apply the frequency filtering depending on a result of the comparison to one of the predetermined thresholds.

4. The method according to claim 3, wherein:
each controlled filter is capable of applying frequency filtering of the low-pass type, each controlled filter being associated with a predetermined threshold;
the control of a controlled filter is configured so that the controlled filter does not apply the frequency filtering if a value of the second time derivative signal of the input signal is greater than its associated predetermined threshold.

5. The method according to claim 3, comprising the steps of:
receiving by a comparator
the second time derivative signal of the input signal at a first input of the comparator and
a signal corresponding to a predetermined threshold at a second input of the comparator,
generating, by the comparator, a comparison signal corresponding to the result of the comparison between the signals received at the first input and the second input of the comparator,
receiving by a channel selector the comparison signal at a control input of the channel selector, each channel selector being associated with a controlled filter capable of applying frequency filtering,
receiving by the channel selector at a first input channels of the channel selector a first signal being a signal received by the controlled filter associated with the channel selector,
receiving by the channel selector at a second input channel of the channel selector a second signal being the output signal of the controlled filter associated with the channel selector, the output signal being the signal received by the controlled filter to which the controlled filter has applied frequency filtering, and
transmitting to an output of the channel selector one of the first signal and second signal depending on the value of the comparison signal.

6. The method according to claim 5, wherein the step of generating a second time derivative signal of the input signal comprises the following steps:
generating a first time derivative signal of the input signal by application of a differentiating filter to the input signal,
generating a first time derivative signal filtered by application of at least one frequency filter of the "low-pass" type to the first time derivative signal, and
generating a second time derivative signal by application of a differentiating filter to the first time derivative signal filtered.

7. The method according to claim 5, wherein at least one frequency filter of the "low-pass" type is configured to apply an average over several time steps.

8. The method according to claim 1, wherein the physical quantity of the turbine engine is the angular speed of an engine shaft of the turbine engine.

9. A computer of a control system of the angular speed of an engine shaft of the turbine engine wherein the computer is configured to implement a method according to claim 1, to receive an input signal that measures a physical quantity of the turbine engine and to generate as output a base signal used in the control of the angular speed of the engine shaft.

10. An assembly including a turbine engine comprising at least one engine shaft and a control system of the angular speed of an engine shaft of the turbine engine, wherein the control system includes a computer according to claim 9 configured to receive, an input signal measuring a physical quantity of the turbine engine and to generate as output a base signal used in the control of the angular speed of the shaft, the control system being configured to control the turbine engine on the basis of the base signal.

11. The assembly according to claim 10, wherein a numerical time derivative of the angular speed of the engine shaft is used by the control system to control the turbine engine during a regime acceleration of the engine, and wherein the input signal is digitized using a quantification step and a sampling step, the control system is designed to supply angular acceleration setpoints which can have values smaller than a ratio of the quantification step to the sampling step, the input signal being a measurement of the angular speed.

12. A computer program comprising instructions configured to implement each of the steps of the method according to claim 1 when the program is executed on a computer.

* * * * *